United States Patent
Chang et al.

(10) Patent No.: US 11,947,624 B2
(45) Date of Patent: Apr. 2, 2024

(54) METHOD AND SYSTEM FOR ANALYZING ERROR OF MEASUREMENT DOMAIN BASED ON SINGLE LOAD JUMP, AND STORAGE MEDIUM

(71) Applicant: BEIJING TENHE ELECTRONIC TECHNOLOGY CO., LTD., Beijing (CN)

(72) Inventors: Hongshan Chang, Beijing (CN); Guang He, Beijing (CN)

(73) Assignee: BEIJING TENHE ELECTRONIC TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/794,257

(22) PCT Filed: Nov. 23, 2020

(86) PCT No.: PCT/CN2020/130780
§ 371 (c)(1),
(2) Date: Jul. 21, 2022

(87) PCT Pub. No.: WO2021/147501
PCT Pub. Date: Jul. 29, 2021

(65) Prior Publication Data
US 2023/0074607 A1  Mar. 9, 2023

(30) Foreign Application Priority Data
Jan. 21, 2020 (CN) .......................... 202010069718.1

(51) Int. Cl.
*G06F 17/18* (2006.01)
*G01R 35/04* (2006.01)

(52) U.S. Cl.
CPC ............. *G06F 17/18* (2013.01); *G01R 35/04* (2013.01)

(58) Field of Classification Search
CPC ................................ G06F 17/18; G01R 35/04
(Continued)

(56) References Cited

U.S. PATENT DOCUMENTS

| 2010/0102824 A1* | 4/2010 | Tremblay | G01R 31/088 |
| | | | 324/522 |
| 2014/0297206 A1* | 10/2014 | Silverman | H02J 13/00034 |
| | | | 702/58 |

FOREIGN PATENT DOCUMENTS

| CN | 101477185 A | 7/2009 |
| CN | 105044651 A | 11/2015 |

(Continued)

OTHER PUBLICATIONS

Yang Guang, et al., A method for remote calibration and large-scale verification of electric energy meter, Electrical Measurement & Instrumentation, 2019, pp. 142-146, vol. 56 No. 16.

*Primary Examiner* — Juan C Ochoa
(74) *Attorney, Agent, or Firm* — Bayramoglu Law Offices LLC (57) ABSTRACT

A method and system for analyzing the error of a measurement domain based on a single load jump and a computer-readable storage medium are provided. According to the method and the system, high-density measurement is performed on the load of a master meter and sub-meters in a measurement domain for a long time to obtain massive load data. After that, based on a single load jump, a load measurement difference of the master meter before and after the jump, and a load measurement difference of a jumping sub-meter before and after the jump are obtained. The error deviation degree of the jumping sub-meter relative to the master meter is uniquely defined. After statistical data of error deviation degrees of all the sub-meters relative to the (Continued)

master meter is obtained, error analysis is performed on the whole measurement domain based on the statistical data.

7 Claims, 2 Drawing Sheets

(58) Field of Classification Search
USPC .......................................................... 703/2
See application file for complete search history.

(56) References Cited

FOREIGN PATENT DOCUMENTS

| | | | |
|---|---|---|---|
| CN | 107462863 | A | 12/2017 |
| CN | 107561481 | A | 1/2018 |
| CN | 107657083 | A | 2/2018 |
| CN | 109298379 | A | 2/2019 |
| CN | 106772203 | B | 5/2019 |
| CN | 110212518 | A | 9/2019 |
| CN | 110375787 | A | 10/2019 |
| CN | 110658487 | A | 1/2020 |
| CN | 110707686 | A | 1/2020 |
| CN | 111289942 | A | 6/2020 |
| JP | S5510567 | A | 1/1980 |
| JP | 2010243372 | A | 10/2010 |

\* cited by examiner

METHOD AND SYSTEM FOR ANALYZING ERROR OF MEASUREMENT DOMAIN BASED ON SINGLE LOAD JUMP, AND STORAGE MEDIUM

CROSS REFERENCE TO THE RELATED APPLICATIONS

This application is the national phase entry of International Application No. PCT/CN2020/130780, filed on Nov. 23, 2020, which is based upon and claims priority to Chinese Patent Application No. 202010069718.1, filed on Jan. 21, 2020, the entire contents of which are incorporated herein by reference.

TECHNICAL FIELD

The present disclosure relates to the technical field of error analysis of a power supply system, in particular, to a method and system for analyzing an error of a measurement domain based on a single load jump, and a computer-readable storage medium.

BACKGROUND

A measurement domain of a power load is constituted by a master meter and many sub-meters. The master meter is responsible for measuring load of a master node, namely, the whole measurement domain, and the sub-meters are responsible for measuring load of sub-nodes.

If there is no error, the measured value of the master meter should be the sum of measured values of the sub-meters. However, in practical application, there is a measurement error in both the master meter and the sub-meters. If errors of these meters are within a tolerable range, a system is in a normal error state. If errors of some meters are beyond the tolerable range, the system is in an abnormal error state. How to determine an error status of each meter and a relative error of an abnormal meter is always a problem to be resolved in the power system. In the prior art, although an error of a single meter can be analyzed, the error of the whole measurement domain has not been analyzed yet. For example, the patent CN106772203B discloses a method for analyzing a comprehensive error of a meter under a harmonic condition. The method obtains the comprehensive error of the meter by calculating a measurement mode error and a calculation accuracy error of the meter under the harmonic condition separately, which makes the error analysis more reasonable and the analysis result more accurate. This method is conducive to putting forward a more reasonable electric energy measurement scheme, but neither the error status of the whole measurement domain nor the relative error of the abnormal meter can be analyzed.

SUMMARY

The present disclosure provides a method and system for analyzing an error in a measurement domain based on a single load jump and a computer-readable storage medium to resolve the technical problem that an existing error analysis method cannot analyze the error status of the whole measurement domain.

According to an aspect of the present disclosure, a method for analyzing the error of a measurement domain based on a single load jump is provided, including the following steps:

step S1: measuring the load of a master meter and sub-meters in a measurement domain to obtain massive load data;

step S2: when determining that a single load jump occurs in the measurement domain, obtaining a load measurement difference of the master meter before and after the jump and a load measurement difference of a jumping sub-meter before and after the jump and calculating an error deviation degree of the jumping sub-meter relative to the master meter based on the load measurement difference of the master meter before and after the jump and the load measurement difference of the jumping sub-meter before and after the jump;

step S3: repeating step S2 until statistical data of error deviation degrees of all the sub-meters relative to the master meter is formed; and step S4: performing error analysis on the measurement domain based on the statistical data.

Further, step S4 specifically includes:

analyzing the statistical data; and if the error deviation degrees of all the sub-meters relative to the master meter are similar and reasonable, determining that an error of the whole measurement domain is normal; if the error deviation degrees of all the sub-meters relative to the master meter are similar but large, determining that an error of the master meter is large; or if an error deviation degree of an individual sub-meter relative to the master meter is large but error deviation degrees of other sub-meters relative to the master meter are similar, determining that an error of the sub-meter with the large deviation degree is large.

Further, the method for analyzing an error of a measurement domain based on a single load jump further includes the following steps:

step S5: continuously performing real-time load measurement on the measurement domain; in the case of a single load jump, calculating an error deviation degree of a jumping sub-meter relative to the master meter; if there is a large difference between a subsequently calculated error deviation degree and an error deviation degree obtained through statistics, and the difference does not disappear afterwards, determining that the jumping sub-meter is faulty; and if the difference disappears afterwards, determining that there is an error caused by a temporary influence factor.

Further, in step S2, the error deviation degree of the jumping sub-meter relative to the master meter is calculated according to the following formula:

$$(\varepsilon_{\Delta Pmaster} - \varepsilon_{\Delta Pk})/\Delta P_{measured\ for\ master} = (\Delta P_{measured\ for\ master} - \Delta P_{measured\ for\ k})/\Delta P_{measured\ for\ master}$$

where $(\varepsilon\Delta P_{master} - \varepsilon_{\Delta Pk})$ is defined as an error deviation value between the master meter and jumping sub-meter k, $(\varepsilon\Delta P_{master} - \varepsilon_{\Delta Pk})/\Delta P_{measured\ for\ master}$ is defined as an error deviation degree of jumping sub-meter k to the master meter, $\Delta P_{measured\ for\ master}$ represents the load measurement difference of the master meter before and after the jump, $\Delta P_{measured\ for\ k}$ represents a load measurement difference of jumping sub-meter k before and after the jump, and calculation is performed when the sum of load differences of other sub-meters approaches zero.

Further, the measurement domain is a meter box, a branch, or a whole transformer area.

Further, in step S2, whether the single load jump occurs in the measurement domain is determined based on the following steps:

step S21: comparing a load change value of each of the sub-meters with a preset effective load jump threshold and a preset load smooth-fluctuation threshold; if the load change value of the sub-meter is greater than or equal to the preset effective load jump threshold, determining that the sub-meter has a load jump; and if the load change value of the sub-meter is less than the preset load smooth-fluctuation threshold, determining that load of the sub-meter fluctuates smoothly; and step S22: taking statistics on the load change status of each of the sub-meters at the same moment, and if only one sub-meter has a load jump and the load of other sub-meters fluctuates smoothly, determining that the single load jump occurs in the measurement domain; otherwise, determining that the single load jump does not occur in the measurement domain.

Further, in step S1, the load data of the master meter and the sub-meters is obtained through window reading, load data at a plurality of time points is obtained at one time window, and if the plurality of pieces of load data in the time window fluctuate smoothly, a smoothing value is used as the load data; or if there is a jump between the plurality of pieces of load data in the time window, the load data read in the window is discarded.

The present disclosure further provides a system for analyzing the error of a measurement domain based on a single load jump, including:

a data measurement unit configured to measure the load of a master meter and sub-meters in a measurement domain to obtain massive load data;

a data processing unit configured to determine whether a single load jump occurs in the measurement domain, calculate an error deviation degree of a jumping sub-meter relative to the master meter when determining that the single load jump occurs in the measurement domain, and form statistical data of error deviation degrees of all the sub-meters relative to the master meter; and an error analysis unit configured to perform error analysis on the measurement domain based on the statistical data.

Further, the data measurement unit is further configured to continuously perform real-time load measurement on the measurement domain; and the error analysis unit is further configured to compare a subsequently calculated error deviation degree and an error deviation degree obtained through statistics; if there is a large difference between the subsequently calculated error deviation degree and the error deviation degree obtained through statistics and the difference does not disappear afterwards, determine that the jumping sub-meter is faulty; and if the difference disappears afterwards, determine that there is an error caused by a temporary influence factor.

The present disclosure further provides a computer-readable storage medium configured to store a computer program for analyzing the error of a measurement domain based on a single load jump, where the computer program is run on a computer to execute the above-described method for analyzing the error of a measurement domain based on a single load jump.

The present disclosure has the following beneficial effects.

According to the method for analyzing the error of a measurement domain based on a single load jump in the present disclosure, high-density measurement is performed on the load of a master meter and sub-meters in a measurement domain for a long time to obtain massive load data. After that, based on a single load jump, a load measurement difference of the master meter before and after the jump and a load measurement difference of a jumping sub-meter before and after the jump are obtained. The error deviation degree of the jumping sub-meter relative to the master meter is uniquely defined. After statistical data of error deviation degrees of all the sub-meters relative to the master meter is obtained, error analysis is performed on the whole measurement domain based on the statistical data, such that the overall error status of the measurement domain, the error status of the master meter, and the error status of each of the sub-meters can be accurately evaluated. The method is worthy of being popularized widely. In addition, the error deviation degree is calculated based on the load measurement difference before and after the jump. A time interval before and after the jump is very short, and the operating environment and operating status of the meter basically remain unchanged, which prevents an error caused by an influence factor from affecting a calculation result, makes the calculation result more accurate, and ensures accuracy of subsequent error analysis.

In addition, the system for analyzing the error of a measurement domain based on a single load jump in the present disclosure also has the above advantages.

The present disclosure may have other objectives, features, and advantages than that described above. The present disclosure will be further described below in detail with reference to accompanying drawings.

BRIEF DESCRIPTION OF THE DRAWINGS

The accompanying drawings constituting a part of the present disclosure are intended to provide further understanding of the present disclosure. Schematic embodiments of the present disclosure and description thereof are intended to illustrate the present disclosure and do not constitute an undue limitation on the present disclosure. In the accompanying drawings.

DETAILED DESCRIPTION OF THE EMBODIMENTS

The detailed description of the embodiments of the present disclosure is given below with reference to the accompanying drawings, but the present disclosure can be implemented in a different manner that falls within the scope of the present disclosure.

Figure 1:
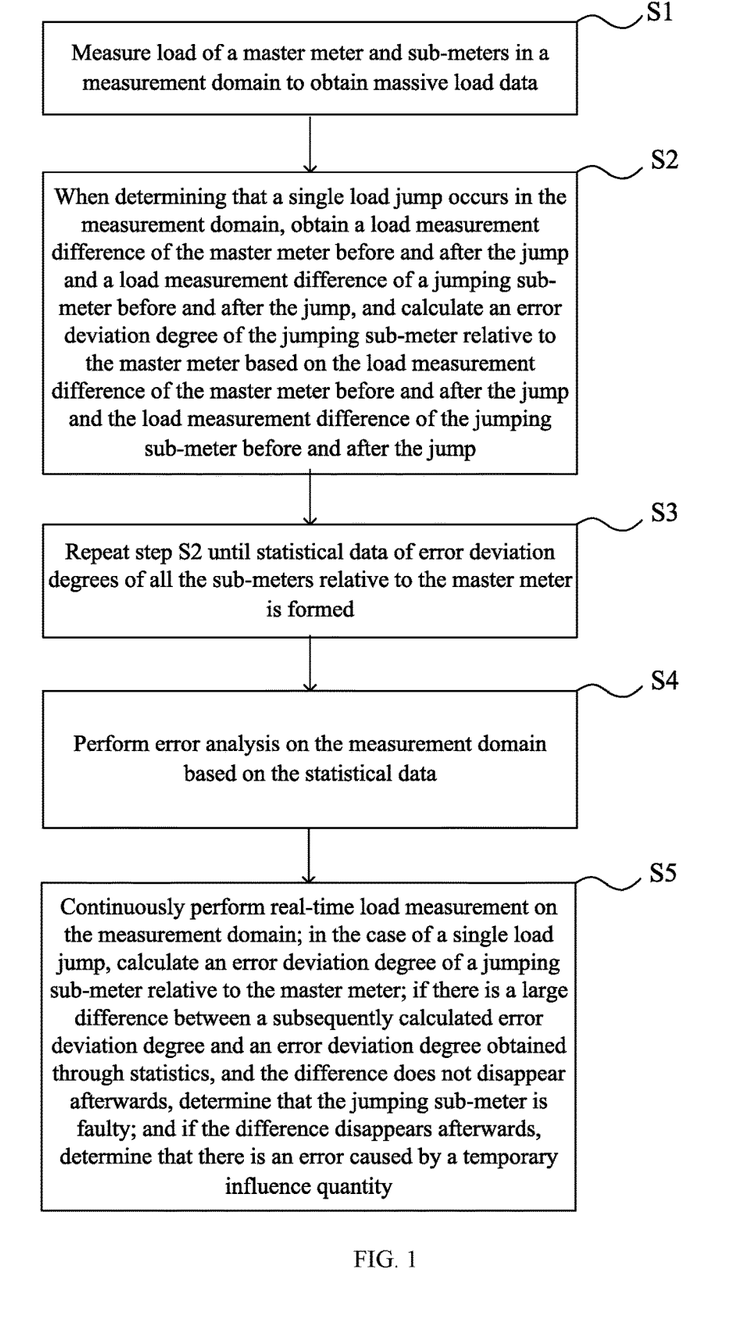
FIG. 1 is a schematic flowchart of a method for analyzing an error of a measurement domain based on a single load jump according to a preferred embodiment of the present disclosure.

For ease of understanding, as shown in FIG. 1, a preferred embodiment of the present disclosure provides a method for analyzing the error of a measurement domain based on a single load jump, including the following steps:

Step S1: Measure the load of a master meter and sub-meters in a measurement domain to obtain massive load data.

Step S2: When determining that a single load jump occurs in the measurement domain, obtain a load measurement difference of the master meter before and after the jump and a load measurement difference of a jumping sub-meter before and after the jump and calculate the error deviation degree of the jumping sub-meter relative to the master meter based on the load measurement difference of the master meter before and after the jump and the load measurement difference of the jumping sub-meter before and after the jump.

Step S3: Repeat step S2 until statistical data of error deviation degrees of all the sub-meters relative to the master meter is formed.

Step S4: Perform error analysis on the measurement domain based on the statistical data.

According to the method for analyzing the error of a measurement domain based on a single load jump in this embodiment, high-density measurement is performed on the load of a master meter and sub-meters in a measurement domain for a long time to obtain massive load data.

After that, based on a single load jump, a load measurement difference of the master meter before and after the jump and a load measurement difference of a jumping sub-meter before and after the jump are obtained. The error deviation degree of the jumping sub-meter relative to the master meter is uniquely defined. After statistical data of error deviation degrees of all the sub-meters relative to the master meter is obtained, error analysis is performed on the whole measurement domain based on the statistical data, such that an overall error status of the measurement domain, an error status of the master meter, and an error status of each of the sub-meters can be accurately evaluated. The method is worthy of being popularized widely. In addition, the error deviation degree is calculated based on the load measurement difference before and after the jump. A time interval before and after the jump is very short, and the operating environment and operating status of the meter basically remain unchanged, which prevents an error caused by an influence factor from affecting a calculation result, makes the calculation result more accurate, and ensures accuracy of subsequent error analysis.

It can be understood that, in step S1, high-density measurement is performed on the load of the master meter and the sub-meters in the measurement domain for a long time to obtain the massive load data. Preferably, the load of the master meter and the sub-meters in the measurement domain is measured in a specific time period, for example, in the second half of the night. Because only a refrigerator, a water heater, an air conditioner, and other frequently-used electrical appliances work periodically in most of the second half of the night, the single load jump occurs more easily. The load data may be basic load parameters of a power system, such as apparent power, active power, reactive power, power factor, current, active current, and reactive current, and change features of these load parameters over time can be used to determine the type and attribution of the load, which can be applied to error analysis of the measurement domain. In addition, the measurement domain may be a meter box, and the master meter and the sub-meters in the measurement domain correspond to a master meter and sub-meters in the meter box, respectively. Alternatively, the measurement domain may be a branch, the master meter in the measurement domain may be composed of branch units of start and end nodes of the branch, and the sub-meters in the measurement domain may correspond to sub-meters in the branch. Alternatively, the measurement domain may be a whole transformer area, the master meter in the measurement domain may be a master meter in the transformer area, and the sub-meters in the measurement domain may correspond to all sub-meters in the transformer area. Therefore, no matter whether the measurement domain is a meter box, a branch, or a whole transformer area, the method for analyzing the error of a measurement domain based on a single load jump in the present disclosure is applicable.

In addition, in step S1, the load data of the master meter and the sub-meters is preferably obtained through window reading, and load data at a plurality of time points is obtained in one time window. If a plurality of pieces of load data in a time window fluctuate smoothly, a smoothing value is used as the load data. If there is a jump between a plurality of pieces of load data in a time window, the load data read in the window is discarded. Time synchronization is required when data collection is performed on the master meter and the sub-meters to ensure reliability of collected data and facilitate subsequent calculation of the error deviation degree.

Time synchronization includes collection time synchronization and measurement time synchronization. The collection time synchronization means that the whole transformer area power supply network initiates load reading commands for different meters at the same time. The measurement time synchronization means that the meters perform load measurement at the same time after receiving the reading commands. High-precision time synchronization can ensure time synchronization of load statistics of all equipment in the transformer area power supply network, which is the basis of the load jump identification technique. In this embodiment, the master meter and the sub-meters of the transformer area power supply network each are equipped with a carrier module to form a carrier network together. A broadband carrier network has high-precision time synchronization, that is, all carrier modules in the carrier network maintain high-precision synchronization based on network reference time, such that the network reference time is used as a time system, and load reading commands are initiated on the carrier modules at the same time to synchronize system collection time. For the measurement time synchronization, the load in the meter is measured by a measurement core and read by a management core. The measurement core is responsible for periodically measuring and recording load data, and the management core is responsible for reading the load data from the measurement core. Therefore, there is a random time difference between the time point of measuring the load and the time point of reading the load, which is between 0 and several hundred milliseconds. This natural time difference makes it difficult to achieve accurate measurement time synchronization. At present, load values of the master meter and the sub-meters are obtained through single-point reading. In single-point reading, reading is performed based on the time point to obtain one piece of reading data, but influences caused by asynchronous measurement time cannot be eliminated. Therefore, in this embodiment, the load values of the master meter and the sub-meters are preferably obtained through window reading. Specifically, the load values are read based on a time window. One time window includes a plurality of time points, and reading data of a plurality of time points can be obtained through reading in one time window. If a plurality of pieces of load data read in one time window fluctuate smoothly, it can be considered that the load of the master meter or the sub-meter is in a steady state at a reading node, and a smoothing value can be used as the load data that is read. The smoothing value may be load data at a certain time point in the window or an average value of a plurality of pieces of load data in the window. If there is a jump in a plurality of pieces of load data read in one time window, it is considered that the load of the meter is not in the steady state at the reading node, the load data read in this time window is discarded. For example, a collection cycle is 1 minute, in other words, the load data is read once in 1 minute, and the data is read by window. The window is 3 seconds, and the data is read once per second, such that 3 pieces of load data can be read in each reading cycle with an interval of 1 second. If the 3 pieces of data of this reading cycle fluctuate smoothly, it can be considered that the load of the master meter or the sub-meter is in the steady state at this node, and a smoothing value of the load value data can be used as the data that is read. If there is a jump in the 3 pieces of load data of this reading cycle, it is considered that the load of the master meter or the sub-meter is not in the steady state at this node, and the data that is read is discarded.

Therefore, in step S1, a steady-state load value is obtained through window reading and data smoothing, and non-steady-state data is directly discarded, thereby effectively eliminating the influences caused by the asynchronous measurement time and ensuring accuracy and reliability of the data that is read.

Figure 2:
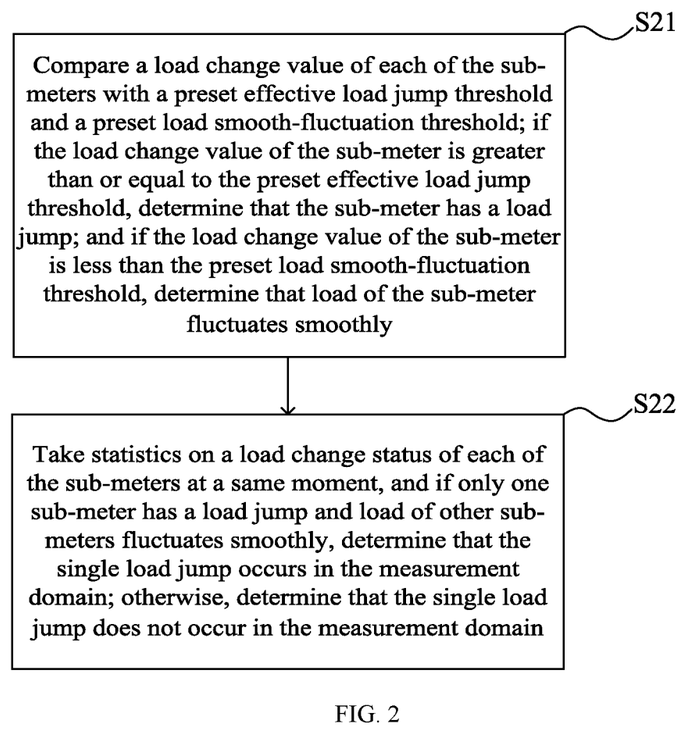
FIG. 2 is a schematic flowchart of step S2 in FIG. 1 according to a preferred embodiment of the present disclosure.

It can be understood that, as shown in FIG. 2, in step S2, whether the single load jump occurs in the measurement domain is determined based on the following steps:

Step S21: Compare a load change value of each of the sub-meters with a preset effective load jump threshold and a preset load smooth-fluctuation threshold; if the load change value of the sub-meter is greater than or equal to the preset effective load jump threshold, determine that the sub-meter has a load jump; and if the load change value of the sub-meter is less than the preset load smooth-fluctuation threshold, determine that load of the sub-meter fluctuates smoothly.

Step S22: Collect statistics on a load change status of each of the sub-meters at the same moment, and if only one sub-meter has a load jump and the load of other sub-meters fluctuates smoothly, determine that the single load jump occurs in the measurement domain; otherwise, determine that the single load jump does not occur in the measurement domain.

It can be understood that, in step S21, a value of the preset effective load jump threshold is usually large. For example, for power, the effective load jump threshold is defined as 1000 W.

When a power change value of the master meter or the sub-meter exceeds 1000 W, it is determined that an effective load jump occurs on the master meter or the sub-meter. When the power change value of the master meter or the sub-meter does not exceed 1000 W, it is determined that no load jump occurs on the master meter or the sub-meter. The value of the load smooth-fluctuation threshold is usually small. For example, for the power, the load smooth-fluctuation threshold is defined as 10 W. When a power change value of a meter is less than 10 W, it is determined that load of the meter fluctuates smoothly. When the power change value of the meter is not less than 10 W, it is determined that the load of the meter does not fluctuate smoothly. When only one sub-meter in the whole measurement domain has a load jump, and the load of other sub-meters fluctuates smoothly, the master meter also has a load jump correspondingly. In this case, it is determined that the single load jump occurs in the measurement domain to facilitate subsequent calculation of the error deviation degree of the jumping sub-meter relative to the master meter. Otherwise, it is determined that no single load jump occurs, in other words, there are a plurality load jumps or overall load of the measurement domain fluctuates smoothly.

It can be understood that, in step S2, the error deviation degree of the jumping sub-meter relative to the master meter is calculated according to the following formula:

$$(\varepsilon_{\Delta Pmaster}-\varepsilon_{\Delta Pk})/\Delta P_{measured\ for\ master}=(\Delta P_{measured\ for\ master}-\Delta P_{measured\ for\ k})/\Delta P_{measured\ for\ master}$$

where $(\varepsilon_{\Delta Pmaster}-\varepsilon_{\Delta Pk})$ is defined as an error deviation value between the master meter and jumping sub-meter k, $(\varepsilon_{\Delta Pmaster}-\varepsilon_{\Delta Pk})/\Delta P_{measured\ for\ master}$ is defined as an error deviation degree of jumping sub-meter k to the master meter, $\Delta P_{measured\ for\ master}$ represents the load measurement difference of the master meter before and after the jump, $\Delta P_{measured\ for\ k}$ represents a load measurement difference of jumping sub-meter k before and after the jump, and calculation is performed when the sum of load differences of other sub-meters approaches zero.

First, the error of the meter includes the error of the meter itself and the error caused by an influence factor. The error of the meter itself includes the error caused by a current sampling circuit, the error caused by a voltage sampling circuit, the error caused by a measurement chip, and the like. The error caused by the influence factor exists because operating environments (temperature, humidity, electromagnetic environment, and the like) and operating statuses of different meters are different. The error caused by the influence factor is random, and sometimes, results in a large calculation deviation.

Specifically, if a true value, a measured value, and the error of a physical quantity (voltage, current, power, or the like) are y, $y_{measured}$, and $\varepsilon$, respectively, the following formula (1) is satisfied:

$$y=y_{measured}-\varepsilon \qquad (1).$$

For time point 1 before the load jump, $y_1=y_1$ measured$-\varepsilon_1$.

For time point 2 after the load jump, $y_1=y_2$ $_{measured}-\varepsilon 2$.

$$y_2-y_1=y_{2\ measured}-y_{1\ measured}-(\varepsilon_2-\varepsilon_1).$$

Therefore, for a load difference before and after a jump at the same measurement point, the above formula is converted into the following:

$$\Delta y=\Delta y_{measured}-(\varepsilon_2-\varepsilon_1)$$

A difference between the measured values of the meter before and after the load jump is used for calculation, the time interval before and after the jump is very short, and the operating environment and operating status of the meter remain basically unchanged. In this way, the influence of the error caused by the influence factor on the calculation result is eliminated, and after the error caused by the influence factor is removed, the error of the difference between the measured values of the meter is approximately linear with the true value of the difference between the measured values. Therefore, $\varepsilon_2-\varepsilon_1=\varepsilon_{2-1}=\varepsilon_A$, and the above formula is converted into the following formula (2):

$\Delta y=\Delta y_{measured}-\varepsilon_A$ (2), where $\varepsilon_A$ represents the error of the difference between the measured values.

In the measurement domain, the true power value of the master meter is equal to the sum of true power values of all the sub-meters. Deduction is performed by using an example in which the master meter and a $k^{th}$ sub-meter jump are described by the following:

$$P_{master}=\Sigma_{i=1, i \neq k}^{k-1} p_i+p_k$$

$P_{master}$ represents the true power value of the master meter, $P_i$ represents the true power value of the $i^{th}$ sub-meter, and $P_k$ represents the true power value of the $k^{th}$ sub-meter.

A difference of true power values before and after the jump is obtained according to the following formula:

$$\Delta P_{master} = \Sigma_{i=1, i \neq k}^{k-1} \Delta p_i + \Delta p_k$$

$\Delta P_{master}$ represents the difference of true power values of the master meter before and after the jump, $\Delta P_i$ represents the difference between true power values of the $i^{th}$ sub-meter before and after the jump, and $\Delta P_k$ represents the difference of true power values of the $k^{th}$ sub-meter before and after the jump.

Formula (2) is applied to obtain the following formula:

$$\Delta P_{measured\ for\ master} - \varepsilon \Delta P_{master} = \Sigma_{i=1, i \neq k}^{n} \Delta P_{measured\ for\ i} - \Sigma_{i=1, i \neq k}^{n} \varepsilon_{\Delta Pi} + \Delta P_{measured\ for\ k} - \varepsilon_{\Delta Pk}$$

In other words, $\varepsilon_{\Delta Pmaster} - \varepsilon_{\Delta Pk} = \Delta P_{measured\ for\ master} - \Delta P_{measured\ for\ k} - \Sigma_{i=1, i \neq k} \Delta p_{measured\ for\ i} + \Sigma_{i=1, i \neq k} \varepsilon_{\Delta Pi}$, where $\varepsilon \Delta P_{master}$ represents the error of the difference between the true power values of the master meter, $\varepsilon_{\Delta Pk}$ represents the error of the difference between the true power values of the $k^{th}$ sub-meter, $\Delta P_{measured\ for\ master}$ represents the difference between measured power values of the master meter, $\Delta p_{measured\ for\ k}$ represents the difference between a measured power values of the $k^{th}$ sub-meter, $\Delta p_{measured\ for\ i}$ represents the difference between measured power values of the $i^{th}$ sub-meter, and $\varepsilon_{\Delta Pi}$ represents the error of the difference between the true power values of the $i^{th}$ sub-meter.

When the single load jump occurs in the measurement domain, in other words, when only the $k^{th}$ sub-meter in all the sub-meters has a load jump, and load of other sub-meters fluctuates smoothly, calculation is performed when the sum of the load differences of the other sub-meters approaches 0. Since $\Sigma_{i=1, i \neq k}^{n} \Delta p_{measured\ for\ i}$ approaches 0, $\Sigma_{i=1, i \neq k}^{n} \varepsilon_{\Delta Pi}$ is closer to 0. Therefore, the above formula is converted into the following formula:

$$\varepsilon \Delta P_{master} - \varepsilon_{\Delta Pk} = \Delta P_{measured\ for\ master} - \Delta P_{measured\ for\ k}$$

Herein, $\varepsilon_{\Delta Pmaster} - \varepsilon_{\Delta Pk}$ is defined as the error deviation value between the master meter and the $k^{th}$ sub-meter, and $(\varepsilon_{\Delta Pmaster} - \varepsilon_{\Delta Pk})/\Delta P_{measured\ for\ master}$ represents the error deviation degree of the $k^{th}$ sub-meter relative to the master meter. Therefore, when the single load jump occurs in the measurement domain, the error deviation degree is calculated as follows:

$$(\varepsilon_{\Delta Pmaster} - \varepsilon_{\Delta Pk})/\Delta P_{measured\ for\ master} = (\Delta P_{measured\ for\ master} - \Delta P_{measured\ for\ k})/\Delta P_{measured\ for\ master} \quad (3)$$

It can be understood that step S4 specifically includes analyzing the statistical data. If the error deviation degrees of all the sub-meters relative to the master meter are similar and reasonable, the error of the whole measurement domain is determined to be normal. If the error deviation degrees of all the sub-meters relative to the master meter are similar but large, the error of the master meter is determined to be large. If the error deviation degree of an individual sub-meter relative to the master meter is large but the error deviation degrees of other sub-meters relative to the master meter are similar, the error of the sub-meter with the large deviation degree is determined to be large.

Specifically, whether the error deviation degree is reasonable is determined based on the accuracy of the master meter and the sub-meter. For example, if the accuracy of both the master meter and the sub-meter is 1%, a deviation degree of −2% to +2% can be considered reasonable. A specific range may be set based on actual accuracy needs and is not specifically limited herein. In addition, whether the error deviation degrees of all the sub-meters relative to the master meter are approximate is determined based on the differences between the error deviation degrees of all the sub-meters relative to the master meter. For example, if all the differences between the error deviation degrees of all the sub-meters relative to the master meter are within a preset range, it is considered that the error deviation degrees of all the sub-meters relative to the master meter are approximate. When the error deviation degree of a sub-meter relative to the master meter exceeds the preset range, it is considered that the error deviation degree of the sub-meter relative to the master meter is large. The specific value of the preset range is set based on actual needs. The statistical data is analyzed, such that the error status of the whole measurement domain, the error status of a single sub-meter, and the error status of the master meter can be effectively determined.

It can be understood that, preferably, the method for analyzing the error of a measurement domain based on a single load jump further includes the following step:

Step S5: Continuously perform real-time load measurement on the measurement domain. In the case of a single load jump, the error deviation degree of a jumping sub-meter relative to the master meter is calculated. If there is a large difference between a subsequently calculated error deviation degree and the error deviation degree obtained through statistics, and the difference does not disappear afterwards, the jumping sub-meter is determined to be faulty. If the difference disappears afterwards, the error is determined to be caused by a temporary influence factor.

In step S5, the real-time load measurement is continuously performed on the measurement domain, such that the cause of the error of each jumping sub-meter can be effectively identified to take a corresponding measure to reduce the error.

Figure 3:
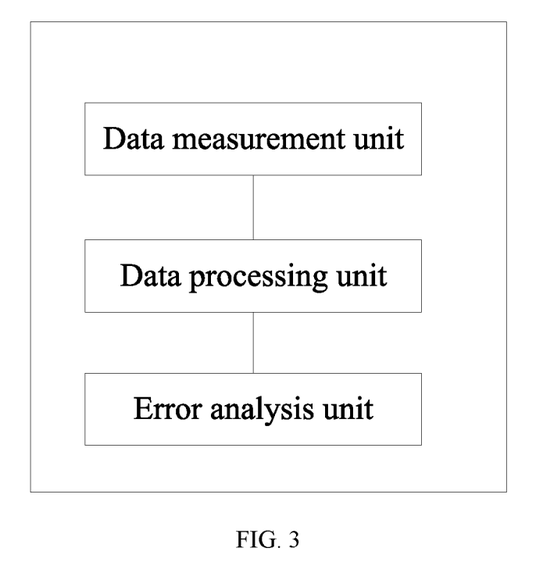
FIG. 3 is a schematic structural diagram of modules of a system for analyzing an error of a measurement domain based on a single load jump according to another embodiment of the present disclosure.

As shown in FIG. 3, another embodiment of the present disclosure provides a system for analyzing the error of the measurement domain based on a single load jump. The system preferably adopts the above-described method for analyzing the error of a measurement domain based on a single load jump, and includes:

a data measurement unit configured to measure the load of the master meter and sub-meters in a measurement domain to obtain massive load data;

a data processing unit configured to determine whether a single load jump occurs in the measurement domain, calculate the error deviation degree of a jumping sub-meter relative to the master meter when determining that the single load jump occurs in the measurement domain, and form statistical data of error deviation degrees of all the sub-meters relative to the master meter; and an error analysis unit configured to perform error analysis on the measurement domain based on the statistical data.

It can be understood that the massive load data is stored and processed on a cloud server, and the error analysis may be performed on the cloud server or on a local computer after a login to the cloud server through the local computer.

It can be understood that, preferably, the data measurement unit is further configured to continuously perform real-time load measurement on the measurement domain; and the error analysis unit is further configured to compare a subsequently calculated error deviation degree and an error deviation degree obtained through statistics. If there is a large difference between the subsequently calculated error deviation degree and the error deviation degree obtained through statistics, and the difference does not disappear afterwards, the jumping sub-meter is determined to be faulty. If the difference disappears afterwards, the error is determined to be caused by a temporary influence factor.

In addition, specific execution processes of the data measurement unit, the data processing unit, and the error analysis unit have been described correspondingly in the above method embodiment, and details are not described herein again.

According to the system for analyzing the error of a measurement domain based on a single load jump in this embodiment, high-density measurement is performed on the load of a master meter and sub-meters in a measurement domain for a long time to obtain massive load data. After that, based on a single load jump, a load measurement difference of the master meter before and after the jump, and a load measurement difference of a jumping sub-meter before and after the jump are obtained. The error deviation degree of the jumping sub-meter relative to the master meter is uniquely defined. After statistical data of error deviation degrees of all the sub-meters relative to the master meter is obtained, error analysis is performed on the whole measurement domain based on the statistical data, such that the overall error status of the measurement domain, the error status of the master meter, and the error status of each of the sub-meters can be accurately evaluated. The method is worthy of being popularized widely. In addition, the error deviation degree is calculated based on the load measurement difference before and after the jump. A time interval before and after the jump is very short, and the operating environment and operating status of the meter basically remain unchanged, which prevents the error caused by an influence factor from affecting a calculation result, makes the calculation result more accurate, and ensures accuracy of subsequent error analysis.

The present disclosure further provides a computer-readable storage medium configured to store a computer program for analyzing the error of a measurement domain based on a single load jump, where the computer program is run on a computer to execute the above-described method for analyzing the error of a measurement domain based on a single load jump.

Generally, a computer-readable medium may be in the following form: a floppy disk, a flexible disk, a hard disk, a magnetic tape, any other type of magnetic medium, a CD-ROM, any other type of optical medium, a punch card, a paper tape, any other type of physical medium with a hole pattern, a random access memory (RAM), a programmable read-only memory (PROM), an erasable programmable read-only memory (EPROM), a flash erasable programmable read-only memory (FLASH-EPROM), any other type of memory chip or cartridge, or any other type of medium that can be read by a computer. An instruction can be further transmitted or received by a transmission medium. The transmission medium may include any tangible or intangible medium. The transmission medium can be used to store, encode, or carry an instruction to be executed by a machine and includes a digital or analog communication signal or an intangible medium that facilitates communication with the above instruction. The transmission medium includes a coaxial cable, a copper wire, and an optical fiber and includes a conductive wire of a bus used to transmit a computer data signal.

The above description merely describes preferred embodiments of the present disclosure and is not intended to limit the present disclosure, and various changes and modifications of the present disclosure may be made by those skilled in the art. Any modifications, equivalent substitutions, improvements, and the like made within the spirit and principle of the present disclosure should be included within the protection scope of the present disclosure.

What is claimed is:

1. A method for analyzing an error of a measurement domain based on a single load jump, wherein the method is performed by a system comprising a computer, a memory, and a computer program stored within the memory, and the method comprising the following steps:

step S1: measuring loads of a master meter and sub-meters in the measurement domain to obtain load data, wherein the measurement domain is a meter box, a branch, or a whole transformer area, and wherein the master meter and the sub-meters each comprises a carrier module and a measurement core, the carrier module of the master meter and the sub-meters forms a carrier network and the carrier module of the master meter and the sub-meters maintains a high-precision time synchronization based on a reference time of the carrier network, and the measurement core of the master meter and the sub-meters measures the loads based on timing and commends of the carrier module;

step S2: when determining that the single load jump occurs in the measurement domain, obtaining a load measurement difference of the master meter before and after the single load jump and a load measurement difference of a jumping sub-meter before and after the single load jump, and calculating an error deviation degree of the jumping sub-meter relative to the master meter based on the load measurement difference of the master meter before and after the single load jump and the load measurement difference of the jumping sub-meter before and after the single load jump, wherein the error deviation degree of the jumping sub-meter relative to the master meter is calculated according to the following formula:

$$(\varepsilon_{\Delta Pmaster} - \varepsilon_{\Delta Pk})/\Delta P_{measured\ for\ master} = (\Delta P_{measured\ for\ meter} - \Delta P_{measured\ for\ k})/\Delta P_{measured\ for\ master}$$

wherein $(\varepsilon_{\Delta Pmaster} - \varepsilon_{\Delta Pk})$ is defined as an error deviation value between the master meter and a jumping sub-meter k, $(\varepsilon_{\Delta Pmaster} - \varepsilon_{\Delta Pk})/\Delta P_{measured\ for\ master}$ is defined as an error deviation degree of the jumping sub-meter k relative to the master meter, $\Delta P_{measured\ for\ master}$ represents the load measurement difference of the master meter before and after the single load jump, $\Delta P_{measured\ for\ k}$ represents a load measurement difference of the jumping sub-meter k before and after the single load jump, and calculation is performed when a sum of load differences of other sub-meters approaches zero;

step S3: repeating step S2 until statistical data of error deviation degrees of all the sub-meters relative to the master meter is formed; and step S4: providing an error analysis on the whole measurement domain based on the statistical data and presenting, by the computer, faulty jumping sub-meters and an error state of the whole measurement domain.

2. The method for analyzing the error of the measurement domain based on the single load jump according to claim 1, further comprising the following step:

step S5: continuously performing real-time load measurement on the measurement domain; in the case of the single load jump, calculating the error deviation degree of the jumping sub-meter relative to the master meter; if there is a difference between a subsequently calculated error deviation degree and an error deviation degree obtained through statistics, and the difference does not disappear afterwards, determining that the jumping sub-meter is faulty; and if the difference disappears afterwards, determining that there is an error caused by a temporary influence factor.

3. The method for analyzing the error of the measurement domain based on the single load jump according to claim 1, wherein in step S2, whether the single load jump occurs in the measurement domain is determined based on the following steps:

step S21: comparing a load change value of each of the sub-meters with a preset effective load jump threshold and a preset load smooth-fluctuation threshold; if the load change value of the sub-meter is greater than or equal to the preset effective load jump threshold, determining that the sub-meter has a load jump; and if the load change value of the sub-meter is less than the preset load smooth-fluctuation threshold, determining that load of the sub-meter fluctuates smoothly; and step S22: taking statistics on a load change status of each of the sub-meters at a same moment, and if only one sub-meter has a load jump and loads of other sub-meters fluctuate smoothly, determining that the single load jump occurs in the measurement domain; otherwise, determining that the single load jump does not occur in the measurement domain.

4. The method for analyzing the error of the measurement domain based on the single load jump according to claim 3, wherein in step S1, the load data of the master meter and the sub-meters is obtained through window reading, load data at a plurality of time points is obtained in one time window, and if a plurality of pieces of load data in the time window fluctuate, a smoothing value is used as the load data; or if there is a jump between the plurality of pieces of load data in the time window, the load data read in the time window is discarded.

5. A system for analyzing an error of a measurement domain based on a single load jump, comprising:

a computer, a memory, and a computer program stored within the memory, wherein when the computer program is executed by the computer, causes the computer to:

measure loads of a master meter and sub-meters in the measurement domain to obtain load data, wherein the measurement domain is a meter box, a branch, or a whole transformer area, and wherein the master meter and the sub-meters each comprises a carrier module and a measurement core, the carrier module of the master meter and the sub-meters forms a carrier network and the carrier module of the master meter and the sub-meters maintains a high-precision time synchronization based on a reference time of the carrier network, and the measurement core of the master meter and the sub-meters measures the loads based on timing and commends of the carrier module;

determine whether the single load jump occurs in the measurement domain, calculate an error deviation degree of a jumping sub-meter relative to the master meter when determining that the single load jump occurs in the measurement domain, and form statistical data of error deviation degrees of all the sub-meters relative to the master meter, wherein the error deviation degree of the jumping sub-meter relative to the master meter is calculated according to the following formula:

$$(\varepsilon_{\Delta Pmaster} - \varepsilon_{\Delta Pk})/\Delta P_{measured\ for\ master} = (\Delta P_{measured\ for\ meter} - \Delta P_{measured\ for\ k})/\Delta P_{measured\ for\ master}$$

wherein $(\varepsilon_{\Delta Pmaster} - \varepsilon_{\Delta Pk})$ is defined as an error deviation value between the master meter and a jumping sub-meter k, $(\varepsilon_{\Delta Pmaster} - \varepsilon_{\Delta Pk})/\Delta P_{measured\ for\ master}$ is defined as an error deviation degree of the jumping sub-meter k relative to the master meter, $\Delta P_{measured\ for\ master}$ represents the load measurement difference of the master meter before and after the single load jump, $\Delta P_{measured\ for\ k}$ represents a load measurement difference of the jumping sub-meter k before and after the single load jump, and calculation is performed when a sum of load differences of other sub-meters approaches zero; and provide an error analysis on the whole measurement domain based on the statistical data and, present, by the computer, faulty jumping sub-meters and an error state of the whole measurement domain.

6. The system for analyzing the error of the measurement domain based on the single load jump according to claim 5, wherein the computer program is further configured to cause the computer to:

continuously perform real-time load measurement on the measurement domain; and compare a subsequently calculated error deviation degree and an error deviation degree obtained through statistics; if there is a difference between the subsequently calculated error deviation degree and the error deviation degree obtained through statistics, and the difference does not disappear afterwards, determine that the jumping sub-meter is faulty; and if the difference disappears afterwards, determine that there is an error caused by a temporary influence factor.

7. A non-transitory computer-readable storage medium, configured to store a computer program for analyzing an error of a measurement domain based on a single load jump, wherein the computer program is run on a computer to execute the method for analyzing the error of the measurement domain based on the single load jump according to claim 1.

* * * * *